United States Patent
Hioka et al.

(10) Patent No.: US 11,099,244 B2
(45) Date of Patent: Aug. 24, 2021

(54) SEMICONDUCTOR DEVICE

(71) Applicant: ABLIC Inc., Chiba (JP)

(72) Inventors: Takaaki Hioka, Chiba (JP); Hirotaka Uemura, Chiba (JP)

(73) Assignee: ABLIC INC., Chiba (JP)

( * ) Notice: Subject to any disclaimer, the term of this patent is extended or adjusted under 35 U.S.C. 154(b) by 24 days.

(21) Appl. No.: 16/444,487

(22) Filed: Jun. 18, 2019

(65) Prior Publication Data
US 2020/0011942 A1    Jan. 9, 2020

(30) Foreign Application Priority Data
Jul. 3, 2018   (JP) ............................. JP2018-126683

(51) Int. Cl.
*G01R 33/07*   (2006.01)
*G01R 33/00*   (2006.01)

(52) U.S. Cl.
CPC ....... *G01R 33/077* (2013.01); *G01R 33/0035* (2013.01)

(58) Field of Classification Search
CPC ............ G01R 33/0035; G01R 33/0017; G01R 33/077
See application file for complete search history.

(56) References Cited

U.S. PATENT DOCUMENTS

| 9,116,192 B2 | 8/2015 | Stahl-Offergeld et al. |
| 2013/0057256 A1 | 3/2013 | Ernst et al. |
| 2018/0159025 A1 | 6/2018 | Hioka et al. |

FOREIGN PATENT DOCUMENTS

JP    2003215171 A  *  7/2003

OTHER PUBLICATIONS

Extended European Search Report in Europe Application No. 19183444.9, dated Nov. 21, 2019, 7 pages.

* cited by examiner

*Primary Examiner* — Minh Q Phan
(74) *Attorney, Agent, or Firm* — Crowell & Moring LLP

(57) ABSTRACT

A semiconductor device includes a semiconductor substrate 10 of a first conductivity type, a vertical Hall element 100 provided on the semiconductor substrate 10, and an excitation conductor 200 provided directly above the vertical Hall element 100 with an intermediation of an insulating film 30. The vertical Hall element 100 includes a semiconductor layer 101 of a second conductivity type provided on the semiconductor substrate 10, and a plurality of electrodes 111 through 115 each constituted from a high-concentration second conductivity type impurity region and provided on the surface of the semiconductor layer 101 along a straight line. A ratio $W_C/W_H$ between a width $W_C$ of the excitation conductor 200 and a width $W_H$ of each of the plurality of electrodes 111 through 115 satisfies $0.3 \le W_C/W_H \le 1.0$.

2 Claims, 3 Drawing Sheets

SEMICONDUCTOR DEVICE

RELATED APPLICATIONS

Priority is claimed on Japanese Patent Application No. 2018-126683, filed on Jul. 3, 2018, the content of which is incorporated herein by reference.

BACKGROUND OF THE INVENTION

1. Field of the Invention

The present invention relates to a semiconductor device, and particularly to a semiconductor device including a vertical Hall element which detects a horizontal magnetic field.

2. Description of the Related Art

A Hall element has been used for various applications because of possible non-contact detection of position and angle as a magnetic sensor. Of these, a magnetic sensor using a horizontal Hall element detecting a magnetic field component perpendicular to the surface of the semiconductor substrate has generally been known well, and various magnetic sensors each using a vertical Hall element detecting a magnetic field component parallel to the surface of the semiconductor substrate have also been proposed. Further, there has also been proposed a magnetic sensor which makes two-dimensional or three-dimensional detection of a magnetic field by combining a horizontal Hall element and a vertical Hall element.

Characteristics variation of a vertical Hall element is, however, large since sensitivity and offset voltage characteristics of the vertical Hall element is apt to be affected by production variation as compared with the horizontal Hall element.

In order to calibrate such characteristics variation, there has been disclosed in U.S. Pat. No. 9,116,192, a method for estimation of the sensitivity of the Hall element in which a current flows through an excitation conductor disposed in the vicinity of a vertical Hall element to thereby generate a calibration magnetic field having a predetermined magnetic flux density in the position of the Hall element. That is, the actual sensitivity of the Hall element is estimated by changing the magnetic flux density of the calibration magnetic field and measuring a change in a Hall voltage supplied from the Hall element during the application of the calibration magnetic field.

Further, there has been illustrated in FIG. 1 of U.S. Pat. No. 9,116,192, a structure in which the horizontal distance between the center of an excitation conductor and the center of a vertical Hall element is separated, i.e., the center of the excitation conductor is shifted in a horizontal direction from the center of the vertical Hall element. It is thus possible to suppress the vertical Hall element from being affected by variation in a magnetic field intensity generated by the excitation conductor due to variation in the width of the excitation conductor, etc., by a process fluctuation during the manufacture of a semiconductor device.

The structure illustrated in FIG. 1 of U.S. Pat. No. 9,116,192 however involves the following drawbacks.

That is, the distance between the vertical Hall element and the excitation conductor is enlarged by separating the horizontal distance between the center of the excitation conductor and the center of the vertical Hall element. Since the magnetic field intensity generated by the current flowing through the excitation conductor is inversely proportional to the distance from the excitation conductor, the intensity of the calibration magnetic field applied to the vertical Hall element becomes small when the distance between the vertical Hall element and the excitation conductor becomes large.

A change in the Hall voltage supplied from the vertical Hall element becomes small when the intensity of the calibration magnetic field applied to the vertical Hall element becomes small. It is thus possible to suppress variation in the intensity of the calibration magnetic field applied to the vertical Hall element, but since the intensity of the calibration magnetic field reduces, accuracy in estimating actual sensitivity of the vertical Hall element degrades as a result.

The current flowing through the excitation conductor is accordingly increased to enlarge the intensity of the calibration magnetic field applied to the vertical Hall element: the amount of heat generation from the excitation conductor thereby increases. In U.S. Pat. No. 9,116,192, the center of the excitation conductor is shifted in the horizontal direction from the center of the vertical Hall element, whereby the excitation conductor approaches to a peripheral circuit such as a circuit which processes an output signal from the vertical Hall element, a circuit to supply a signal to the vertical Hall element, or the like, and which are disposed around the vertical Hall element. Temperature distribution therefore occurs in the peripheral circuit due to the heat generation of the excitation conductor. The characteristics of the peripheral circuit thereby fluctuate, thus leading to degradation of the accuracy in estimating actual characteristics of the vertical Hall element.

Incidentally, increasing the distance between the excitation conductor and the peripheral circuit may suppress the generation of the temperature distribution in the peripheral circuit, but may not be realistic because of heading against the miniaturization of the semiconductor device.

SUMMARY OF THE INVENTION

The present invention therefore aims to provide a semiconductor device capable of suppressing heating of an excitation conductor from affecting a peripheral circuit, enlarging the intensity of a calibration magnetic field received by a vertical Hall element, and thereby performing high-accuracy calibration of the vertical Hall element.

A semiconductor device according to one aspect of the present invention is provided which includes a semiconductor substrate of a first conductivity type, a vertical Hall element provided on the semiconductor substrate, and an excitation conductor provided directly above the vertical Hall element with an intermediation of an insulating film. The vertical Hall element includes a semiconductor layer of a second conductivity type provided on the semiconductor substrate, and a plurality of electrodes each constituted from a high-concentration second conductivity type impurity region and provided on the surface of the semiconductor layer along a straight line. A ratio $W_C/W_H$ between a width $W_C$ of the excitation conductor and a width $W_H$ of each of the plurality of electrodes satisfying an inequality $0.3 \leq W_C/W_H \leq 1.0$.

According to the present invention, the excitation conductor is disposed directly above the vertical Hall element, and the ratio $W_C/W_H$ between the width $W_C$ of the excitation conductor and the width $W_H$ of each electrode of the vertical Hall element is assumed to be less than or equal to 1.0, whereby a peripheral circuit such as a circuit processing an output signal from the vertical Hall element, a circuit to supply a signal to the vertical Hall element, or the like, and the excitation conductor can be disposed so as not to approach each other. Also, since it is possible to suppress an increase in the amount of heat generation from the excitation conductor by setting $W_C/W_H$ to be greater than or equal to 0.3, occurrence of a temperature distribution in the peripheral circuit can be prevented. Further, the intensity of a calibration magnetic field received by the vertical Hall element can be enlarged by disposing the excitation conductor directly above the vertical Hall element. It is thus possible to enlarge the intensity of the calibration magnetic field applied to the vertical Hall element and perform calibration of the vertical Hall element with high accuracy while suppressing the amount of heat generation from the excitation conductor.

DETAILED DESCRIPTION OF THE PREFERRED EMBODIMENTS

Embodiments of the present invention will hereinafter be described in detail with reference to the accompanying drawings.

Figure 1A:
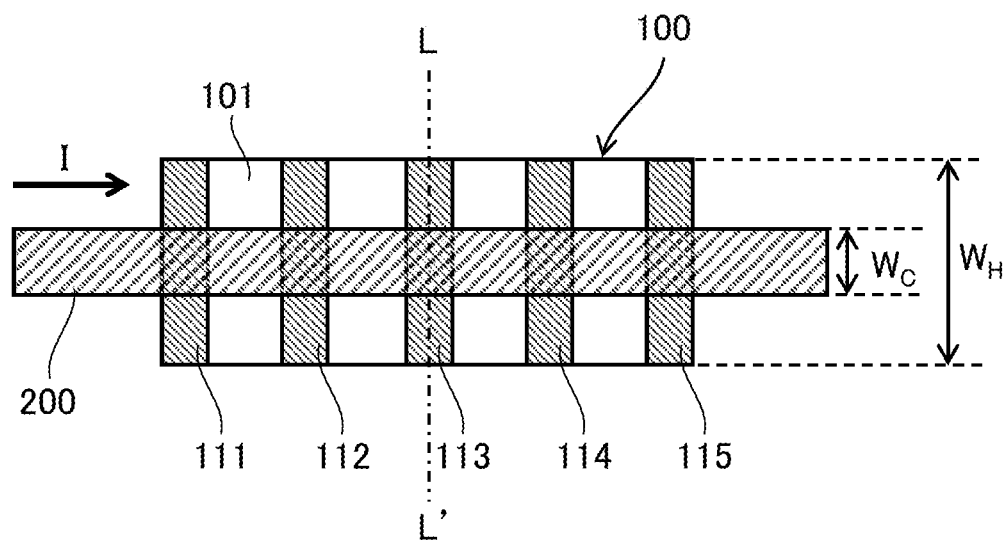
FIG. 1A is a plan view of a semiconductor device having a vertical Hall element according to an embodiment of the present invention.
Figure 1B:
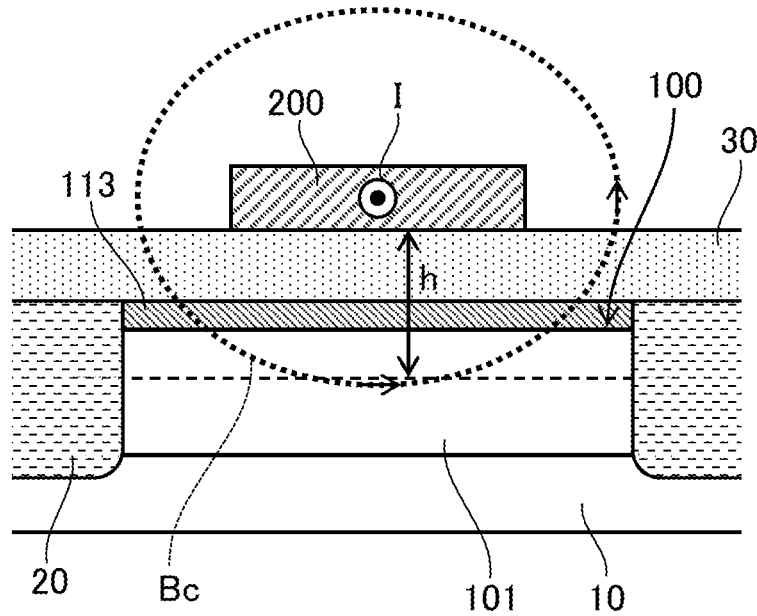
FIG. 1B is a sectional view taken along line L-L' of FIG. 1A.

FIG. 1 is a view for describing a semiconductor device having a vertical Hall element according to the embodiment of the present invention in which FIG. 1A is a plan view, and FIG. 1B is a sectional view taken along line L-L' of FIG. 1A.

As illustrated in FIG. 1, the semiconductor device according to the present embodiment includes a semiconductor substrate 10 of a P type (first conductivity type), a P-type element isolation diffusion layer 20, a vertical Hall element 100 provided on the semiconductor substrate 10, an insulating film 30 provided on the vertical Hall element 100, and an excitation conductor 200 provided on the insulating film 30.

The vertical Hall element 100 is constituted from an N type (second conductivity type) semiconductor layer 101 serving as a magnetism sensing part which is provided on the semiconductor substrate 10, and electrodes 111 through 115 each constituted from an N type impurity region are provided on the surface of the semiconductor layer 101 along a straight line. The electrodes 111 through 115 have a rectangular shape and a common width $W_H$ and are provided in parallel to each other.

The element isolation diffusion layer 20 electrically isolates the vertical Hall element 100 from other regions (not illustrated) on the semiconductor substrate 10.

Elements such as transistors provided in other regions on the semiconductor substrate 10 electrically isolated from the vertical Hall element 100 by the element isolation diffusion layer 20. The elements constitute a circuit which processes an output signal from the vertical Hall element 100, a circuit which supplies a signal to the vertical Hall element 100, or a circuit which compensates the characteristics of the vertical Hall element 100 by a calibration magnetic field, or the like (hereinafter called a "peripheral circuit").

The excitation conductor 200 has a linear shape and provided directly above the vertical Hall element 100 with an intermediation of the insulating film 30 in such a manner that a longitudinal center line of the excitation conductor 200 and a longitudinal center line of the semiconductor layer (magnetism sensing part) 101 of the vertical Hall element 100 coincide. The distance between the excitation conductor 200 and the vertical Hall element 100 thereby becomes the smallest, and hence the intensity of the calibration magnetic field received by the vertical Hall element 100 can be made larger. Further, the uniform calibration magnetic field can be supplied to the whole vertical Hall element 100.

Then, in the present embodiment, the ratio $W_C/W_H$ between the width $W_C$ of the excitation conductor 200 on the vertical Hall element 100 and the width $W_H$ of each of the electrodes 111 through 115 of the vertical Hall element 100 satisfies an inequality $0.3 \leq W_C/W_H \leq 1.0$. A description will be made below as to the reason why such an inequality is taken.

As the calibration magnetic field applied to the vertical Hall element 100 and generated from the excitation conductor 200 becomes small, a change in the Hall voltage supplied from the vertical Hall element 100 becomes small, thereby degrading the accuracy for estimation of actual sensitivity of the vertical Hall element 100. It is therefore preferable to apply the calibration magnetic field of 2 to 3 mT or more.

Figure 2:
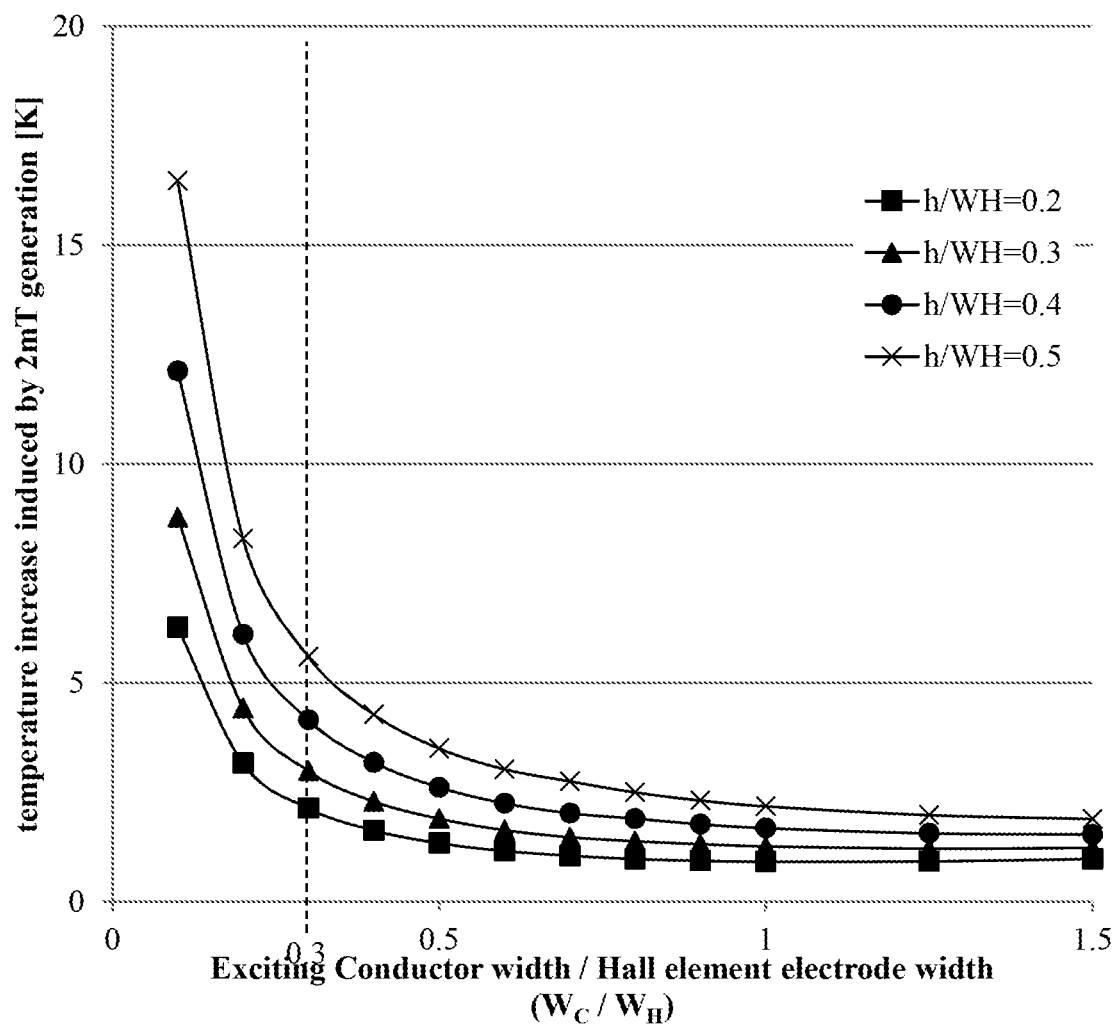
FIG. 2 is a graph illustrating a result in which a relation between a ratio ($W_C/W_H$) between a width $W_C$ of an excitation conductor and a width $W_H$ of each electrode of the vertical Hall element and an increase in the temperature of the excitation conductor when the excitation conductor generates a magnetic field having a magnetic flux density of 2 mT is simulated by changing a ratio ($h/W_H$) between a distance h from the center of the vertical Hall element in a substrate depthwise direction to the excitation conductor and the width $W_H$ of each electrode of the vertical Hall element.

With the above in view, FIG. 2 illustrates a graph of a result in which the relation between the ratio $W_C/W_H$ and an increase in the temperature of the excitation conductor 200 when the excitation conductor 200 generates a magnetic field having a magnetic flux density of 2 mT is simulated. Here, $W_C/W_H$ is a ratio between the width $W_C$ of the excitation conductor 200 and the width $W_H$ of each of the electrodes 111 through 115 of the vertical Hall element 100 and the simulation is made by changing a ratio $h/W_H$ between a distance h from the center of the vertical Hall element 100, which is mainly constituted from the semiconductor layer 101, in a substrate depthwise direction to the excitation conductor 200 and the width $W_H$ of each of the electrodes 111 through 115 of the vertical Hall element 100.

It is understood from the graph of FIG. 2 that the increase in the temperature of the excitation conductor 200 abruptly becomes large upon the ratio $W_C/W_H$ between the width $W_C$ of the excitation conductor and the width $W_H$ of each of the electrodes 111 through 115 of the vertical Hall element reaching less than or equal to 0.3. Incidentally, FIG. 2 illustrates the simulation result in which the excitation conductor 200 generates the magnetic field having the magnetic flux density of 2 mT as an example, it has been confirmed that even when the excitation conductor 200 generates a magnetic field having a magnetic flux density of 3 mT or more, the shape of the graph becomes similar, and an increase in the temperature of the excitation conductor 200 abruptly becomes large upon $W_C/W_H$ reaching less than or equal to 0.3.

Accordingly, by setting the ratio $W_C/W_H$ between the width $W_C$ of the excitation conductor and the width $W_H$ of each of the electrodes 111 through 115 of the vertical Hall element to be greater than or equal to 0.3, it is possible to suppress the occurrence of a temperature distribution in the peripheral circuit upon applying a current to the excitation conductor 200 to apply a calibration magnetic field of more than 2 to 3 mT to the vertical Hall element 100.

On the other hand, the peripheral circuit and the excitation conductor 200 approach each other when the width $W_C$ of the excitation conductor 200 becomes larger than the width $W_H$ of each of the electrodes 111 through 115 of the vertical Hall element 100. That is, the peripheral circuit becomes vulnerable to the heat generation from the excitation conductor 200, and the accuracy of estimating the actual characteristics of the vertical Hall element 100 is degraded. It is thus preferable that in order to prevent the excitation conductor 200 from approaching the peripheral circuit, the width $W_C$ of the excitation conductor 200 is not made larger than the width of each of the electrodes 111 through 115 of the vertical Hall element 100, i.e., the ratio $W_C/W_H$ between the width $W_C$ of the excitation conductor and the width $W_H$ of each of the electrodes 111 through 115 of the vertical Hall element is set to be less than or equal to 1.0.

Figure 3:
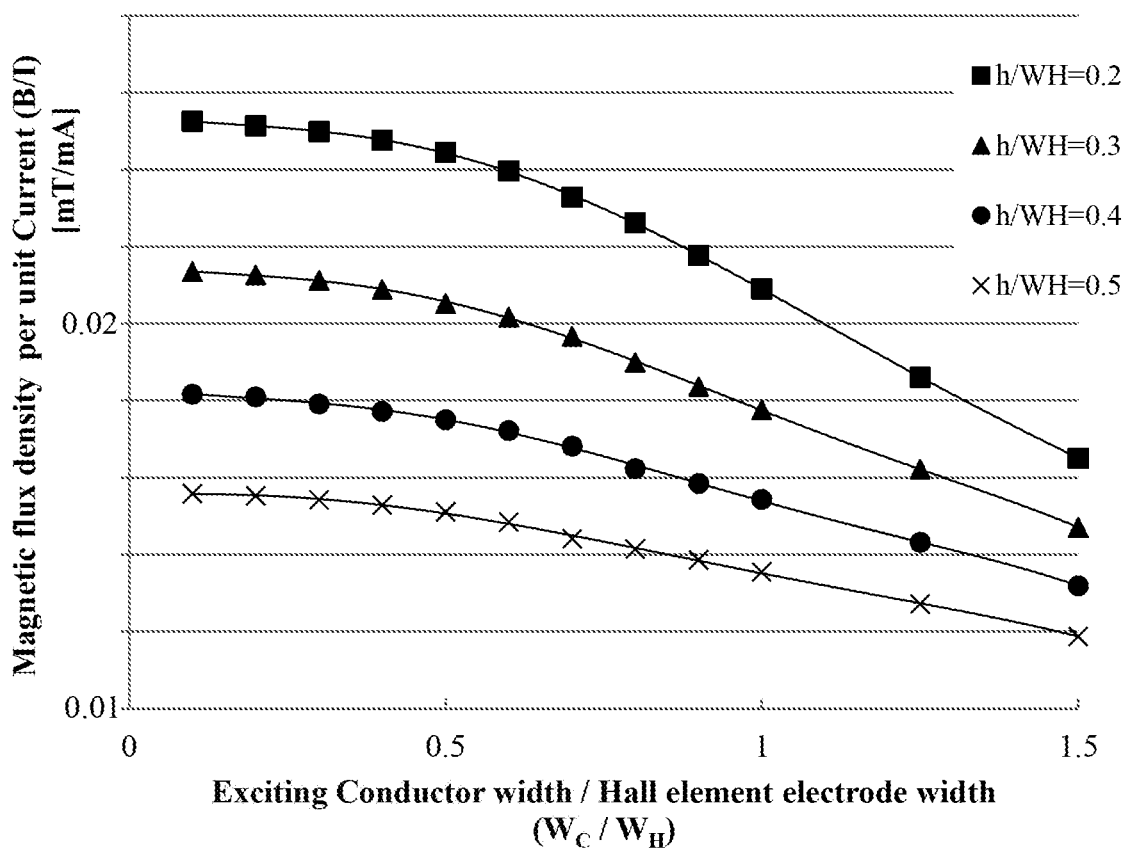
FIG. 3 is a graph illustrating a result in which a relation between the ratio ($W_C/W_H$) between the width $W_C$ of the excitation conductor and the width $W_H$ of each electrode of the vertical Hall element and a magnetic flux density (B/I) applied to the vertical Hall element per unit current flowing through the excitation conductor is simulated by changing the ratio ($h/W_H$) between the distance h from the center of the vertical Hall element in a substrate depthwise direction to the excitation conductor 200 and the width $W_H$ of each electrode of the vertical Hall element.

FIG. 3 is a graph illustrating a result in which a relation between the ratio $W_C/W_H$ and a magnetic flux density (B/I) applied to the vertical Hall element 100 per unit current flowing through the excitation conductor 200 is simulated. Here, $W_C/W_H$ is a ratio between the width $W_C$ of the excitation conductor 200 and the width $W_H$ of each of the electrodes 111 through 115 of the vertical Hall element 100, and the simulation is made by changing the ratio $h/W_H$ between the distance h from the center of the vertical Hall element 100 in a depthwise direction of the substrate to the excitation conductor 200 and the width $W_H$ of each of the electrodes 111 through 115 of the vertical Hall element 100.

It is understood from the graph of FIG. 3 that the magnetic flux density (B/I) applied to the vertical Hall element 100 per unit current flowing through the excitation conductor 200 becomes small as the ratio $h/W_H$ between the distance h from the center of the vertical Hall element 100 in the depthwise direction of the substrate to the excitation conductor 200 and the width $W_H$ of each of the electrodes 111 through 115 of the vertical Hall element 100 is made large. Hence the ration $h/W_H$ is preferably as small as possible.

Further, as can be seen from FIG. 2, the increase in the temperature of the excitation conductor 200 becomes large as the ratio $h/W_H$ between the distance h from the center of the vertical Hall element 100 in the substrate depthwise direction to the excitation conductor and the width $W_H$ of each of the electrodes 111 through 115 of the vertical Hall element 100 is made lamer.

That is, as the distance h from the center of the vertical Hall element 100 in the substrate depthwise direction to the excitation conductor 200 becomes large, more current must flow to the excitation conductor 200 in order to apply a required calibration magnetic field to the vertical Hall element 100. The increase in the temperature of the excitation conductor 200 therefore becomes large, thereby affecting the peripheral circuit.

Accordingly, even if the ratio $W_C/W_H$ between the width $W_C$ of the excitation conductor 200 and the width $W_H$ of each of the electrodes 111 through 115 of the vertical Hall element 100 is within a range which satisfies $0.3 \leq W_C/W_H \leq 1.0$, the increase in the temperature of the excitation conductor 200 is preferably 5° C. or less to suppress affection to the peripheral circuit.

From FIG. 3, consequently, the ratio $h/W_H$ between the distance h from the center of the vertical Hall element 100 in the substrate depthwise direction to the excitation conductor 200 and the width $W_H$ of each of the electrodes 111 through 115 of the vertical Hall element 100 is preferably set to 0.4 or less at which the increase in the temperature of the excitation conductor 200 becomes 5° C. or less in the range in which the ratio $W_C/W_H$ between the width $W_C$ of the excitation conductor and the width $W_H$ of each of the electrodes 111 through 115 of the vertical Hall element is 0.3 or more.

Incidentally, in a process of forming the vertical Hall element 100, forming the insulating film 30 thereon, and then forming wirings to electrically connect the plurality of elements such as the transistors constituting the peripheral circuit to each other, the excitation conductor 200 can be formed simultaneously with the wirings. According to the present embodiment, it is therefore possible to form the excitation conductor 200 without increasing a manufacturing process.

Further, even if, for example, when $W_C/W_H$ is designed to be 0.5, variation occurs in the width of the excitation conductor 200 due to variations in the manufacturing process so that $W_C/W_H$ becomes 0.5+α or 0.5−α, a change in the magnetic flux density relative to its change is small as can be seen from FIG. 3 because the ratio $W_C/W_H$ between the width $W_C$ of the excitation conductor 200 and the width $W_H$ of each of the electrodes 111 through 115 of the vertical Hall element 100 is $0.3 \leq W_C/W_H \leq 1.0$. That is, even if the width of the excitation conductor 200 or the like varies due to the variations in the manufacturing process, a fluctuation in the intensity of the magnetic field generated from the excitation conductor 200 can be suppressed to be small.

Here, resistivity of the excitation conductor 200 is preferably as low as possible to reduce the amount of heat generation, e.g., the excitation conductor 200 is preferably formed of Al or the like. Further, the excitation conductor 200 is preferably as thick as possible to reduce the amount of heat generation, e.g., desirably 0.5 μm or more.

A description will next be made as to a method of compensating the characteristics of the vertical Hall element 100 in the semiconductor device according to the present embodiment by the calibration magnetic field.

A current flow through the excitation conductor 200 generates a calibration magnetic field Bc having a predetermined magnetic flux density indicated by a dotted line around the excitation conductor 200 as illustrated in FIG. 1B, whereby the calibration magnetic field Bc is applied to the vertical Hall element 100 in a horizontal direction. At this time, the predetermined magnetic flux density is preferably set to be a few mT or so.

In a state in which the calibration magnetic field Bc is applied, a drive current is supplied to the electrode serving as a drive current supply electrode, of the electrodes 111 through 115 of the vertical Hall element 100. Since the drive current receives the Lorentz force caused by the calibration magnetic field Bc, a potential difference is generated between the electrodes serving as Hall voltage output electrodes, of the electrodes 111 through 115 of the vertical Hall element 100, whereby this potential difference is obtained as a Hall voltage. Specifically, a Hall voltage is provided between the electrodes 112 and 114 by, for example, supplying the drive current to the electrodes 111, 113, and 115 in such a manner that a current flows from the electrode 113 to the electrodes 111 and 115.

The drive current and the gain of an amplifier connected to the output of the vertical Hall element 100, etc. are adjusted based on the Hall voltage obtained in this manner, an offset voltage remaining after calculation of a plurality of Hall voltages obtained by changing the direction of supplying the drive current by a spinning current method, etc., thereby carrying out compensation of the characteristics of the vertical Hall element 100. It is thus possible to achieve a semiconductor device having the vertical Hall element 100 which suppresses variation in its characteristics with high accuracy.

The embodiment of the present invention has been described above, but the present invention is not limited to the above embodiment. It is needless to say that various changes can be made thereto within the scope not departing from the gist of the present invention.

For example, in the above embodiment, the excitation conductor 200 is illustrated in the single layer, but the thickness of the excitation conductor 200 may be increased as a whole by using a multilayer wiring to increase the whole thickness of the excitation conductor 200.

Also, there has been illustrated the example using AL or the like as the excitation conductor 200, but a conductor such as polysilicon or the like may be used.

Further, the first conductivity type and the second conductivity type have been described as the P type and the N type respectively, but they may be replaced with each other so that the first conductivity type functions as the N type and the second conductivity type functions as the P type.

Furthermore, the above embodiment has illustrated the example in which the vertical Hall element 100 has the five electrodes, but the vertical Hall element 100 may have three in total including two for the supply of the drive current and one for the output of the Hall voltage, or more.

What is claimed is:

1. A semiconductor device, comprising:
   a semiconductor substrate of a first conductivity type;
   a vertical Hall element on the semiconductor substrate; and
   an excitation conductor directly above the vertical Hall element with an intermediation of an insulating film,
   the vertical Hall element comprising:
      a semiconductor layer of a second conductivity type on the semiconductor substrate; and
      a plurality of electrodes each constituted from a high-concentration second conductivity type impurity region, and on a surface of the semiconductor layer along a straight line, and
      a ratio $W_C/W_H$ between a width $W_C$ of the excitation conductor and a width $W_H$ of each of the plurality of electrodes satisfying an inequality $0.3 \leq W_C/W_H \leq 1.0$
      wherein a ratio $h/W_H$ between a distance h from a center of the vertical Hall element in a substrate depthwise direction to a lower surface of the excitation conductor and the width $W_H$ of each of the plurality of electrodes is equal to or less than 0.4.

2. The semiconductor device according to claim 1, wherein the excitation conductor has a linear shape, and a longitudinal center line of the excitation conductor and a longitudinal center line of the semiconductor layer of the vertical Hall element coincide.

* * * * *